United States Patent [19]

Inaba et al.

[11] Patent Number: 5,369,881
[45] Date of Patent: Dec. 6, 1994

[54] METHOD OF FORMING CIRCUIT WIRING PATTERN

[75] Inventors: Masaichi Inaba; Norimasa Fujita, both of Ushiku, Japan

[73] Assignee: Nippon Mektron, Ltd., Tokyo, Japan

[21] Appl. No.: 124,268

[22] Filed: Sep. 20, 1993

[30] Foreign Application Priority Data

Sep. 25, 1992 [JP] Japan ................................ 4-280973

[51] Int. Cl.⁵ ............................................. H05K 3/02
[52] U.S. Cl. ...................................... 29/846; 156/901; 174/259; 228/180.1
[58] Field of Search ........................ 29/896; 228/180; 174/259, 262; 156/901, 902

[56] References Cited

U.S. PATENT DOCUMENTS

| | | | |
|---|---|---|---|
| 3,350,250 | 10/1967 | Sanz et al. | 29/846 X |
| 3,495,921 | 5/1969 | Leenhouts | 29/846 X |
| 4,572,764 | 2/1986 | Fan | 29/846 X |
| 4,614,837 | 9/1986 | Kane et al. | 29/846 X |
| 4,889,584 | 12/1989 | Wada et al. | 29/846 X |

OTHER PUBLICATIONS

IBM Technical Disclosure Bulletin vol. 1 No. 2 Aug. 1958 p. 25 by Miles.
IBM Technical Disclosure Bulletin vol. 10 No. 4 Sep. 1967 pp. 359–360 by Peter et al.

*Primary Examiner*—Carl J. Arbes
*Attorney, Agent, or Firm*—Chilton, Alix & Van Kirk

[57] ABSTRACT

This invention provides a method of forming a circuit wiring pattern which cannot be formed by a prior art method such as etching or plating. This method comprises a step of forming trenches for forming a circuit wiring pattern at predetermined positions on at least one of the surface of an insulating base material and then filling a conductive material into the trenches, a step of removing conductor layers in such a manner that the conductor layers formed by the step described above exist only in the trenches formed in the insulating base material and gap portions of the circuit wiring pattern comprising the conductor layers formed in the trenches of the insulating base material are exposed, and a step of forming an insulating surface protection layer.

21 Claims, 4 Drawing Sheets

METHOD OF FORMING CIRCUIT WIRING PATTERN

BACKGROUND OF THE INVENTION

1. Field of the Invention

This invention relates to a circuit wiring board having a required circuit wiring pattern on an insulating base material that has widely been employed in a variety of electronic devices and apparatii. More particularly, the present invention relates to a method of forming a circuit wiring pattern. Further particularly, it relates to a method of forming a circuit wiring pattern which cannot be formed by formation steps according to the prior art such as etching or plating.

2. Description of the Related Art

Methods of forming a circuit wiring pattern on a circuit wiring board according to the prior art include a method shown in FIGS. 5A and 5B of the accompanying drawings. First of all, a resist layer 24 having a required circuit wiring pattern shape is formed on a surface of a copper foil 22 of a copper-coated laminate plate 23 comprising an insulating base material 21 and the copper foil 22 as the principal constituent members, by ordinary photo-fabrication, as shown in FIG. 5A. Next, the exposed portions are removed by etching as shown in FIG. 5B, and a circuit wiring pattern 25 is formed by peeling and removing the resist layer 24. This method is generally referred to as the subtractive process.

Another method according to the prior art is shown in FIGS. 6A and 6B. A plating resist pattern 27 is first formed at portions other than a circuit wiring pattern formation portion on an insulating base material 26 not equipped with a copper foil but having an adhesive, as shown in FIG. 6A. A conductor 28 having a required thickness is then deposited on only the circuit wiring pattern portion by means such as electroless plating or electrolytic plating as shown in FIG. 6B. Thereafter, the plating resist 27 is removed. This is a so-called additive process.

When a surface treatment layer of gold, nickel, etc, is required on the surface of the circuit wiring pattern in the prior art methods described above, a film is formed by plating.

The prior art methods described above cannot form a circuit wiring pattern having a film of titanium, ceramics, amorphous metal layers, etc, that cannot be formed by plating, on the surface of the circuit wiring pattern. These methods cannot form, either, a circuit wiring pattern comprising a material which cannot be plated or etched.

SUMMARY OF THE INVENTION

The present invention provides a method of forming a circuit wiring pattern having a surface treatment layer which has been impossible in the past.

To accomplish this object, the present invention employs a method of forming a circuit wiring pattern, which comprises a step of forming trenches at predetermined positions for defining a circuit wiring pattern on at least one of the surfaces of an insulating base material and then filling a conductive material into the trenches, a step of removing conductive material in such a manner that the conductors formed by the step described above exist in only the trenches formed in the insulating base material and gap portions of the circuit wiring pattern which comprises conductive material in the trenches of the insulating base material are exposed, and a step of forming an insulating surface protection layer on the surface of the circuit wiring pattern.

In the formation steps described above, a method of forming various functional films on the circuit wiring pattern may be the one which first forms the trenches at predetermined positions for forming the circuit wiring pattern on at least one of the surfaces of the insulating base material and then forms the functional films on the surface of the insulating base material.

Another method in accordance with the invention comprises forming trenches at predetermined positions for defining a circuit wiring pattern on at least one of the surfaces of an insulating base material and then forming a conductive film on the surface of the insulating base material, a step of removing the conductive films formed by the step described above in such a manner that these conductive films remain only in the trenches formed in the insulating base material and the insulating base material is exposed, and a step of forming an insulating surface protection layer on the conductive films.

The trenches formed at predetermined positions for defining the pattern on the insulating base material in the steps described above can be formed by first forming a metal mask layer having a desired shape on the insulating base material, and then applying an excimer laser beam for ablation.

The methods of forming the trenches further include a method which forms a resist layer into a desired shape on the insulating base material and then etches the insulating base material, and a method which effects shaping and machining of the insulating base material.

The step of removing the conductor layer, the functional film and the conductive film and exposing the insulating base material layer in the pattern gaps includes a step of cutting and polishing from the side of the conductor layer and the films, and a step of forming a resist layer at required positions of the conductor layer and selectively removing the exposed portions, and these steps may be selected suitably.

DESCRIPTION OF THE PREFERRED EMBODIMENTS

Hereinafter, preferred embodiments of the present invention will be described in further detail with reference to the accompanying drawings.

FIGS. 1A through 1F are sectional views showing the steps of forming a circuit wiring board having formed thereon a copper circuit wiring pattern having a surface treatment metal layer which cannot be easily formed by plating. The drawings particularly show the steps of forming trenches in an insulating base material by applying an excimer laser beam.

Figure 1A:
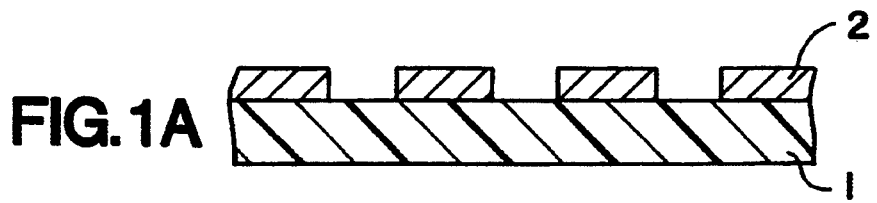
FIGS. 1A through 1F are sectional views showing formation steps of a method of forming a circuit wiring pattern according to an embodiment of the present invention.

First of all, as shown in FIG. 1A, a copper-plated laminate sheet not provided with an adhesive is prepared, and a metal mask layer 2 having a negative shape of a circuit wiring pattern which will be finally necessary is formed on at least one of the surfaces of the insulating base material 1 by a conventional photo-fabrication process.

Figure 1B:
Figure 1B:
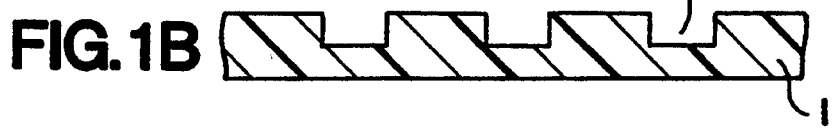

Next, an excimer laser beam A is applied from the side of the metal mask layer 2 as shown in FIG. 1B, and trenches 3 for forming the circuit wiring pattern are formed by ablation and at the same time, the metal mask layer 2 which becomes unnecessary is removed by etching.

Figure 1C:

Then, a film serving as a surface treatment metal layer 4 such as a titanium film is deposited into a required thickness on the surface of the insulating base material 1 by thin film formation means such as vacuum deposition, as shown in FIG. 1C.

Figure 1D:
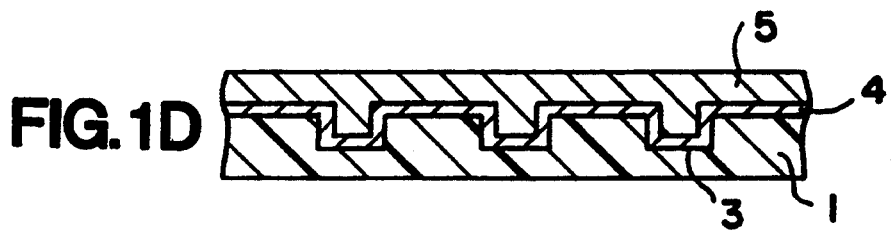

Further, an electrically conductive metal layer 5 such as copper is deposited by electroplating as shown in FIG. 1D.

Figure 1E:
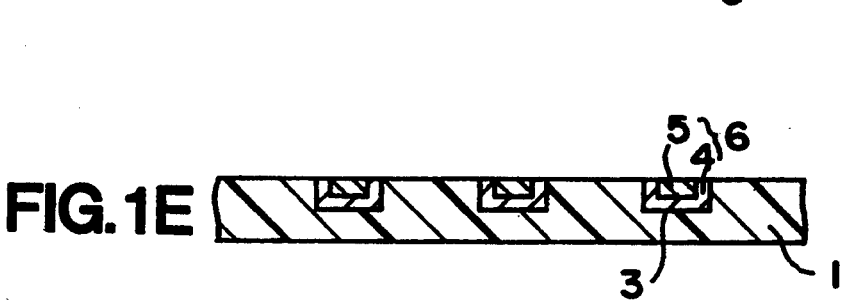

Next, cutting and polishing are carried out from the side of the conductive metal layer 5, such as copper deposited by the step described above, in such a manner that the insulating base material 1 is exposed at the gap portions between the trenches as shown in FIG. 1E, and the circuit wiring pattern is thus defined only by the conductive material in the trenches 3.

Figure 1F:
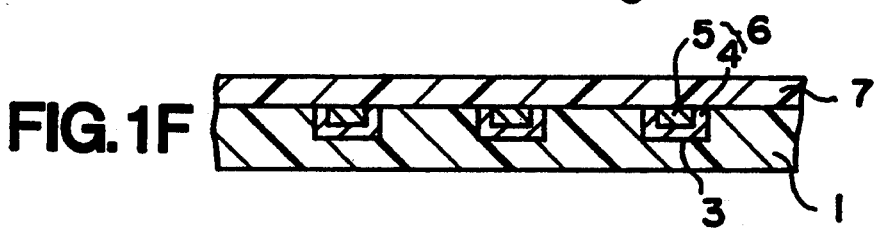

Subsequently, an insulating surface protection layer 7 is formed on the surface of the circuit wiring pattern 6 comprising the surface treatment metal layer 4 and the conductive metal layer 5 such as copper, by applying an insulating resin such as polyimide varnish on the surface of the circuit wiring pattern, or bonding an insulating resin film such as a polyimide film by an adhesive, as shown in FIG. 1F. This embodiment illustrates the formation step using the polyimide varnish.

Figure 2A:
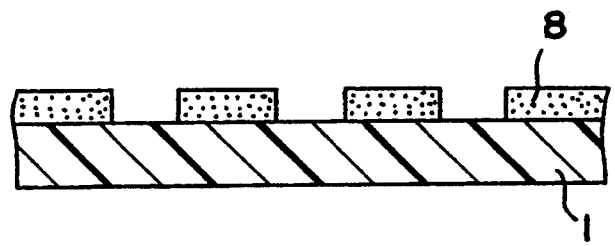
FIGS. 2A and 2B are sectional views useful for explaining a part of production steps of another method of forming a circuit wiring pattern according to an embodiment of the present invention.
Figure 2B:
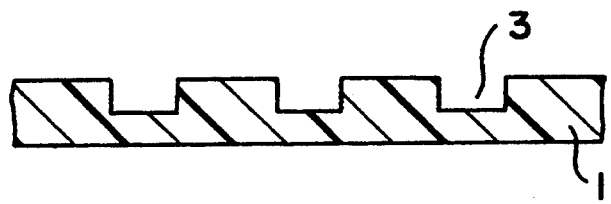

In the formation steps described above, the trenches 3 can be formed in the insulating base material 1 by another method shown in FIGS. 2A and 2B.

First of all, as shown in FIG. 2A, a resist layer 8 is formed into a required shape on one of the surfaces of the insulating base material 1 and then the insulating material 1 is etched and the resist layer 8 is peeled as shown in FIG. 2B. In this way, the trenches 3 can be formed, too.

The trenches 3 can also be formed by a shaping and machining method of various insulating materials which has been employed for ordinary shaping and machining.

Figure 3A:
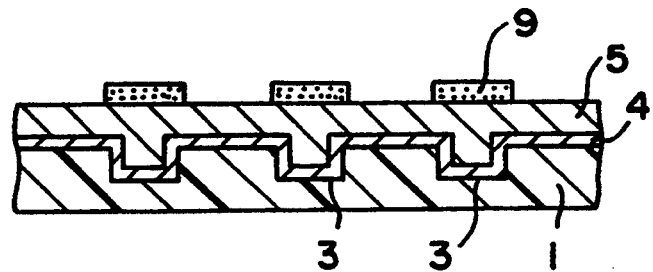
FIGS. 3A and 3B are sectional views useful for explaining a part of production steps of another method of forming a circuit wiring pattern according to an embodiment of the present invention.
Figure 3B:
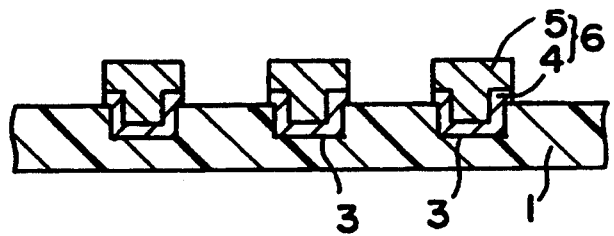

In the formation steps described above, another method of exposing the insulating base material at the gap portions between the trenches 3, 3 and using them as the pattern gaps of the circuit wiring patterns 6 is shown in FIGS. 3A and 3B.

First of all, as shown in FIG. 3A, resist layers 9 are formed at required positions by the ordinary photo-fabrication process, and the exposed portions are then removed selectively by etching as shown in FIG. 3B. In this way, the pattern gaps can also be formed. In this case, the thickness of the conductor of the circuit wiring pattern 6 can be increased.

In the circuit wiring board having the circuit pattern 6 constituted by the steps described above, the circuit wiring pattern 6 can be exposed by applying an excimer laser beam to a part of the insulating base material 1 or etching it by resin etching, and electrical connection with an external substrate can be established or various circuit components can be mounted to the exposed portions.

Though the embodiment described above represents the case where the circuit wiring pattern 6 includes the surface treatment metal layer 4, the steps shown in FIGS. 4A through 4D can be employed when a pattern having a structure not equipped with this surface treatment metal layer 4 is formed.

Figure 4A:
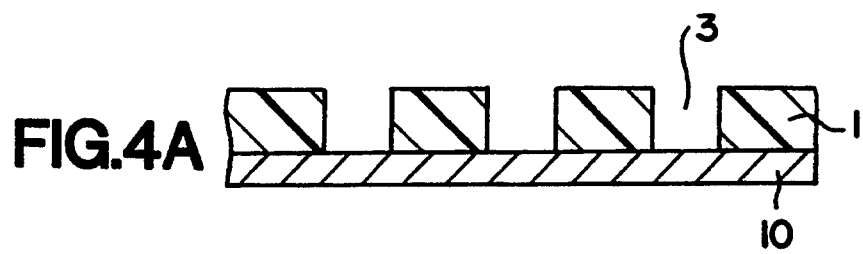
FIGS. 4A through 4D are sectional views useful for explaining a part of production steps of another method of forming a circuit wiring pattern according to an embodiment of the present invention.

First of all, a conductor layer 10 of copper, etc, is formed on one of the surfaces of the insulating base material 1 by vacuum deposition and subsequent plating as shown in FIG. 4A, or a one-side copper-plated laminate sheet is prepared and the trenches 3 are formed in the insulating material 1 in such a manner as to penetrate through it and to reach the conductor layer 10 by the methods described above.

Figure 4B:
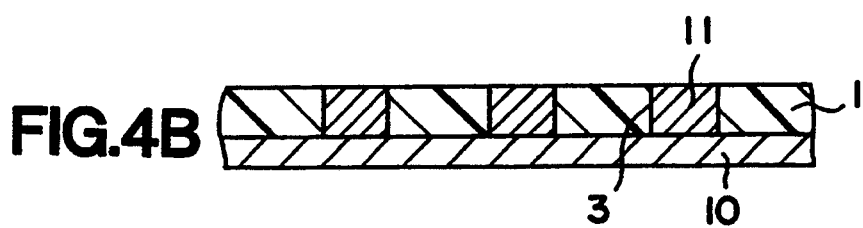

Next, as shown in FIG. 4B, a conductive metal 11 which cannot be etched easily, such as platinum, is filled into the trenches 3 by plating, for example. Cutting and polishing may be practised in this case, whenever necessary.

Figure 4C:
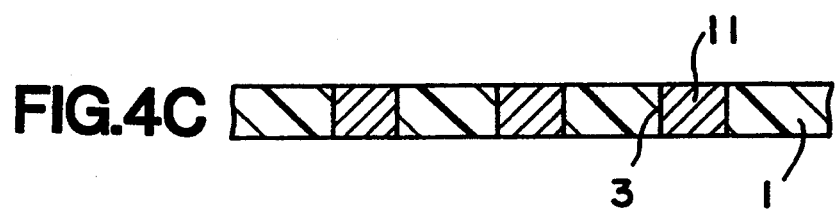

Further, as shown in FIG. 4C, the conductor layer 10 on the insulating base material 1 is removed by etching.

Figure 4D:
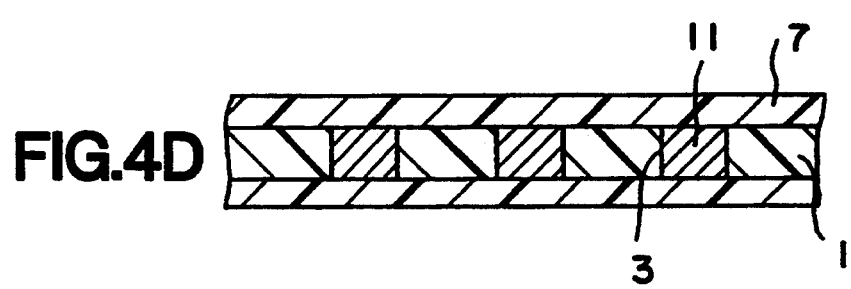
Figure 5A:
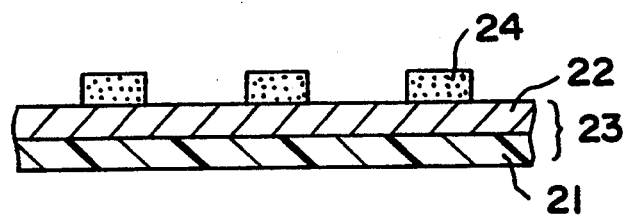
FIGS. 5A and 5B are sectional views useful for explaining a method of forming a circuit wiring pattern according to the prior art.
Figure 5B:
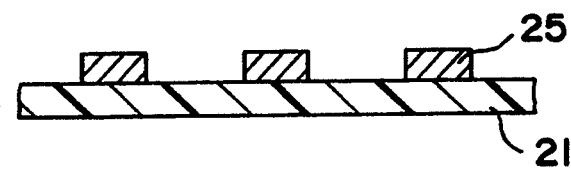
Figure 6A:
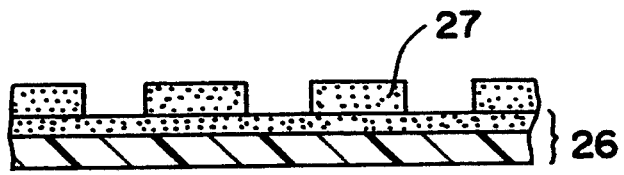
FIGS. 6A and 6B are sectional views useful for explaining another method of forming a circuit wiring pattern according to the prior art.
Figure 6B:
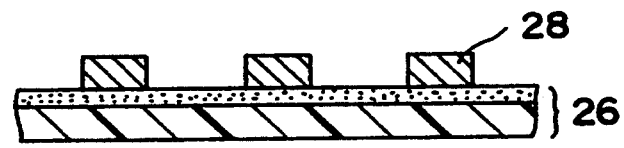

Subsequently, as shown in FIG. 4D, an insulating resin such as a polyimide varnish is coated on both surfaces or an insulating resin film such as a polyimide film is bonded by an adhesive, so as to form the insulating surface protection layer 7. In this way, it is possible to obtain the circuit wiring board having a difficultly etchable circuit wiring pattern.

According to the formation method of the circuit wiring pattern of the present invention, it is possible to form the circuit wiring pattern comprising the surface metal layer, which is difficult to form by plating, and the difficultly etchable conductor, on the surface of the circuit wiring pattern.

If the trenches are formed by the excimer laser, the difference of thickness between the circuit pattern width at the upper bottom portion of the trench and the width at the lower bottom portion becomes extremely small even when the pattern thickness becomes great, and a circuit wiring pattern having a substantially rectangular sectional structure can be formed.

Further, so long as conduction resistance satisfies the specification, a circuit wiring pattern comprising a conductor film at the trenches formed in the insulating base material alone can be formed. Accordingly, a circuit wiring board having high flexibility can be constituted.

What is claimed is:
1. A method of forming a circuit wiring pattern comprising the steps of:
 forming trenches at predetermined positions for defining a circuit wiring pattern, on at least one of the surfaces of an insulating base material, and filling said trenches with a conductive material;

removing said conductive material in such a manner that a conductive layer resulting from said filling exists only in registration with said trenches formed in said insulating base material, and non-conductive gap portions of said circuit wiring pattern comprising said insulating base material intermediate said trenches are exposed; and forming an insulating surface protection layer over the surface of said circuit wiring pattern.

2. A method of forming a circuit wiring pattern according to claim 1 wherein said trenches are so formed as to penetrate through said insulating base material from the other surface and wherein the step of filling the trenches with conductive material includes forming a conductive layer on said one surface of said insulating base material, the method further including the step of removing said conductive layer from said one surface of said insulating base material after formation of the circuit wiring pattern.

3. A method of forming a circuit wiring pattern according to claim 2 wherein said step of removing conductive material to expose said insulating base material layer in pattern gaps comprises cutting and polishing from the side of said conductive layer.

4. A method of forming a circuit wiring pattern according to claim 2 wherein said step of removing conductive material to expose said insulating base material layer in pattern gaps comprises selectively removing exposed metallic material after a resist layer is formed in desired regions.

5. A method of forming a circuit wiring pattern according to claim 1 wherein said trenches are formed by molding and machining.

6. A method of forming a circuit wiring pattern according to claim 1 wherein said step of removing conductive material to expose said insulating base material layer in pattern gaps comprises cutting and polishing from the side of said conductive layer.

7. A method of forming a circuit wiring pattern according to claim 1 wherein said step of removing conductive material to expose said insulating base material layer in pattern gaps comprises selectively removing exposed metallic material after a resist layer is formed in desired regions.

8. A method of forming a circuit wiring pattern comprising the steps of:

forming trenches at predetermined positions for defining a circuit wiring pattern on at least one of the surfaces of an insulating base material, and forming a functional film on the surface of said insulating base material including the surfaces of said trenches;

filling said trenches with conductive material;

removing said conductive material and functional film in such a manner that layers of said conductive material and said functional film remain in said trenches formed in said insulating base material, and non-conductive gap portions of said circuit wiring pattern are exposed intermediate said trenches; and forming an insulating surface protection layer over the surface of said circuit wiring pattern defined by said conductive material in said trenches and said gap portions.

9. A method of forming a circuit wiring pattern according to claim 8 wherein said conductor layer is formed on one of the surface of said insulating base material and said trenches are so formed as to penetrate through said insulating base material from the other surface and which wherein the step of filling the trenches with conductive material includes forming a conductive layer on said one surface of said insulating base material, the method further including the step of removing said conductive layer from said one surface of said insulating base material after formation of the circuit wiring pattern.

10. A method of forming a circuit wiring pattern according to claim 9 wherein said step of removing conductive material to expose said insulating base material layer in pattern gaps comprises cutting and polishing from the side of said conductive layer.

11. A method of forming a circuit wiring pattern according to claim 8 wherein said trenches are formed by molding and machining.

12. A method of forming a circuit wiring pattern according to claim 9 wherein said step of removing conductive material to expose said insulating base material layer in pattern gaps comprises selectively removing exposed metallic material after a resist layer is formed in desired regions.

13. A method of forming a circuit wiring pattern according to claim 8 wherein said step of removing conductive material to expose said insulating base material layer in pattern gaps comprises cutting and polishing from the side of said conductive layer.

14. A method of forming a circuit wiring pattern according to claim 8 wherein said step of removing conductive material to expose said insulating base material layer in pattern gaps comprises selectively removing exposed metallic material after a resist layer is formed in desired regions.

15. A method of forming a circuit wiring pattern comprising the steps of:

forming trenches at predetermined positions for defining a circuit wiring pattern on at least one of the surfaces of an insulating base material, and then forming a layer of conductive material on the surface of said insulating base material, said layer of conductive material extending into and filling said trenches;

removing said conductive material in such a manner that said conductive layer exists only in said trenches formed in said insulating base material and said insulating base material is exposed in regions displaced from said trenches; and forming an insulating surface protection layer over said remaining conductive layer.

16. A method of forming a circuit wiring pattern according to claim 15 wherein said conductor layer is formed on one of the surface of said insulating base material and said trenches are so formed as to penetrate through said insulating base material from the other surface and which wherein the steer of filling the trenches with conductive material includes forming a conductive layer on said one surface of said insulating base material, the method further including the step of removing said conductive layer from said one surface of said insulating base material after formation of the circuit wiring pattern.

17. A method of forming a circuit wiring pattern according to claim 16 wherein said step of removing conductive material to expose said insulating base material layer in pattern gaps comprises cutting and polishing from the side of said conductive layer.

18. A method of forming a circuit wiring pattern according to claim 16 wherein said step of removing conductive material to expose said insulating base material layer in pattern gaps comprises selectively removing exposed metallic material after a resist layer is formed in desired regions.

19. A method of forming a circuit wiring pattern according to claim 15 wherein said trenches are formed by molding and machining.

20. A method of forming a circuit wiring pattern according to claim 15 wherein said step of removing conductive material to expose said insulating base material layer in pattern gaps comprises cutting and polishing from the side of said conductive layer.

21. A method of forming a circuit wiring pattern according to claim 15 wherein said step of removing conductive material to expose said insulating base material layer in pattern gaps comprises selectively removing exposed metallic material after a resist layer is formed in desired regions.

* * * * *